United States Patent
Hirukawa et al.

(10) Patent No.: US 10,589,514 B2
(45) Date of Patent: Mar. 17, 2020

(54) SCREEN PRINTING DEVICE HAVING CONVEYANCE SECTION FOR DISCHARGING AND INTRODUCING BOTH THE SCREEN MASK AND BOARD SUPPORT MEMBER

(71) Applicant: FUJI CORPORATION, Chiryu-shi (JP)

(72) Inventors: Ritsuo Hirukawa, Nishio (JP); Yasunori Kamegai, Owariasahi (JP); Takeshi Kondo, Chiryu (JP); Mitsuaki Kato, Anjo (JP); Tsuyoshi Mizukoshi, Chiryu (JP); Atsushi Torii, Toyota (JP); Jun Iisaka, Nisshin (JP); Kazuhiro Kusunoki, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 161 days.

(21) Appl. No.: 15/580,522

(22) PCT Filed: Jun. 8, 2015

(86) PCT No.: PCT/JP2015/066526
§ 371 (c)(1),
(2) Date: Dec. 7, 2017

(87) PCT Pub. No.: WO2016/199207
PCT Pub. Date: Dec. 15, 2016

(65) Prior Publication Data
US 2018/0162118 A1 Jun. 14, 2018

(51) Int. Cl.
*B41F 15/18* (2006.01)
*B41F 15/36* (2006.01)
(Continued)

(52) U.S. Cl.
CPC .............. *B41F 15/36* (2013.01); *B41F 15/08* (2013.01); *B41F 15/0881* (2013.01);
(Continued)

(58) Field of Classification Search
CPC .......... B41F 15/08; B41F 15/18; B41F 15/20; B41F 15/26; B41F 15/36; B41F 27/005; B41P 2215/112; B41P 2215/114
(Continued)

(56) References Cited

U.S. PATENT DOCUMENTS

2011/0297020 A1* 12/2011 Tanaka ................ B41F 15/0881
101/126

FOREIGN PATENT DOCUMENTS

| JP | 4-107146 A | 4/1992 |
|----|------------|--------|
| JP | 4-199763 A | 7/1992 |

(Continued)

OTHER PUBLICATIONS

International Search Report dated Aug. 25, 2015, in PCT/JP2015/066526, filed Jun. 8, 2015.
(Continued)

*Primary Examiner* — Leslie J Evanisko
(74) *Attorney, Agent, or Firm* — Oblon, McClelland, Maier & Neustadt, L.L.P.

(57) ABSTRACT

A printing device including a conveyance rod which discharges and introduces a screen mask and a board support member; and a control section. The control section performs a mask exchange process including a mask discharge process of discharging the screen mask to be discharged and a mask introduction process of introducing the screen mask to be introduced by controlling a conveyance rod. In addition, the control section performs a support member exchange process including a support member discharge process of discharging the board support member to be discharged and
(Continued)

a support member introduction process of introducing the support member to be introduced by controlling the conveyance rod.

6 Claims, 11 Drawing Sheets

(51) Int. Cl.
*B41F 15/26* (2006.01)
*B41F 15/08* (2006.01)
*B41F 27/00* (2006.01)
*B41F 15/20* (2006.01)
*H05K 3/12* (2006.01)

(52) U.S. Cl.
CPC .............. *B41F 15/18* (2013.01); *B41F 15/20* (2013.01); *B41F 15/26* (2013.01); *B41F 27/005* (2013.01); *B41P 2215/112* (2013.01); *B41P 2215/114* (2013.01); *H05K 3/1216* (2013.01)

(58) Field of Classification Search
USPC .................................................. 101/126, 114
See application file for complete search history.

(56) References Cited

FOREIGN PATENT DOCUMENTS

| | | | |
|---|---|---|---|
| JP | 07186362 A | * | 7/1995 |
| JP | 3170862 B2 | | 5/2001 |

OTHER PUBLICATIONS

Extended European Search Report dated Mar. 2, 2018 in the corresponding European Application No. 15894892.7 (citing documents AA, AB and AO therein 7 pages).

* cited by examiner

SCREEN PRINTING DEVICE HAVING CONVEYANCE SECTION FOR DISCHARGING AND INTRODUCING BOTH THE SCREEN MASK AND BOARD SUPPORT MEMBER

TECHNICAL FIELD

The present application relates to a printing device and a board work device.

BACKGROUND ART

In the related art, in a printing device which performs a printing process of a viscous fluid on a board by using a screen mask, there is known a printing device which performs automatic exchanging of the screen mask. For example, PTL 1 discloses a printing device which includes a rod that protrudes downward and a slider which slides the screen mask by moving the rod to perform loading and unloading the screen mask to and from a main body frame.

CITATION LIST

Patent Literature

PTL 1: JP-A-04-107146

SUMMARY

Technical Problem

In a board work device that performs a work on a board such as printing, there is a case where a board support member for supporting the board is used during the work. In a case where a support member suitable for a type of board to be worked is used, exchange of the board support member is necessary. However, in the printing device of PTL 1, the exchange of the board support member is not considered.

The disclosure has been made to solve such a problem and the main object thereof is to perform automatic exchanging of the board support member.

Solution to Problem

The disclosure adopts the following means so as to achieve the main object described above.

According to the present disclosure, there is provided a printing device which performs a printing process of viscous fluid on a board fixed on a board support member by using a screen mask, the printing device including: a support member conveyance section which discharges and introduces the screen mask and the board support member; and an exchange control section which can perform a mask exchange process including a mask discharge process of discharging the screen mask to be discharged and a mask introduction process of introducing the screen mask to be introduced by controlling the support member conveyance section and can perform a support member exchange process including a support member discharge process of discharging the board support member to be discharged and support member introduction process of introducing the board support member to be introduced by controlling the support member conveyance section.

The printing device includes the support member conveyance section which discharges and introduces the screen mask and the board support member. In the printing device, the support member exchange process including the discharge and the introduction of the board support member can be performed by using the support member conveyance section. Therefore, in the printing device, the automatic exchanging of the board support member can be performed. In addition, the printing device can also perform the mask exchange process of performing the discharge and the introduction of the screen mask by using the support member conveyance section. In other words, the automatic exchanging of the board support member and the automatic exchanging of the screen mask can be performed by using the same support member conveyance section together. Therefore, a device configuration can be made compact compared with a case where the printing device includes a conveyance section for exchanging the screen mask and a conveyance section for exchanging the board support member separately, for example.

A board work device according to the present disclosure performs a board work on a board fixed on a board support member, the board work device including: a support member conveyance section which discharges and introduces the board support member; a board fixing section which can dispose the board support member thereon and fixes the board by the disposed board support member when the board work is performed; a positioning section which performs positioning of the board support member in a horizontal direction by moving the board support member disposed on the board fixing section; and an exchange control section which performs a support member exchange process including a support member discharge process of discharging the board support member to be discharged by controlling the support member conveyance section and a support member introduction process of conveying the board support member to be introduced to the board fixing section by controlling the support member conveyance section and performing positioning of the conveyed board support member by controlling the positioning section.

In the board work device, the support member exchange process including the discharge and the introduction of the board support member can be performed by using the support member conveyance section which discharges and introduces the board support member. Therefore, the board work device can perform automatic exchanging of the board support member. In addition, in the support member introduction process, the board work device performs the positioning of the conveyed board support member by using the positioning section. Therefore, positional deviation of the board support member introduced by the support member introduction process in the board fixing section can be suppressed. In the board work device of the disclosure, various aspects of the printing device of the present disclosure may be adopted or various configurations may be added to the printing device of the disclosure.

DESCRIPTION OF EMBODIMENTS

Figure 1:
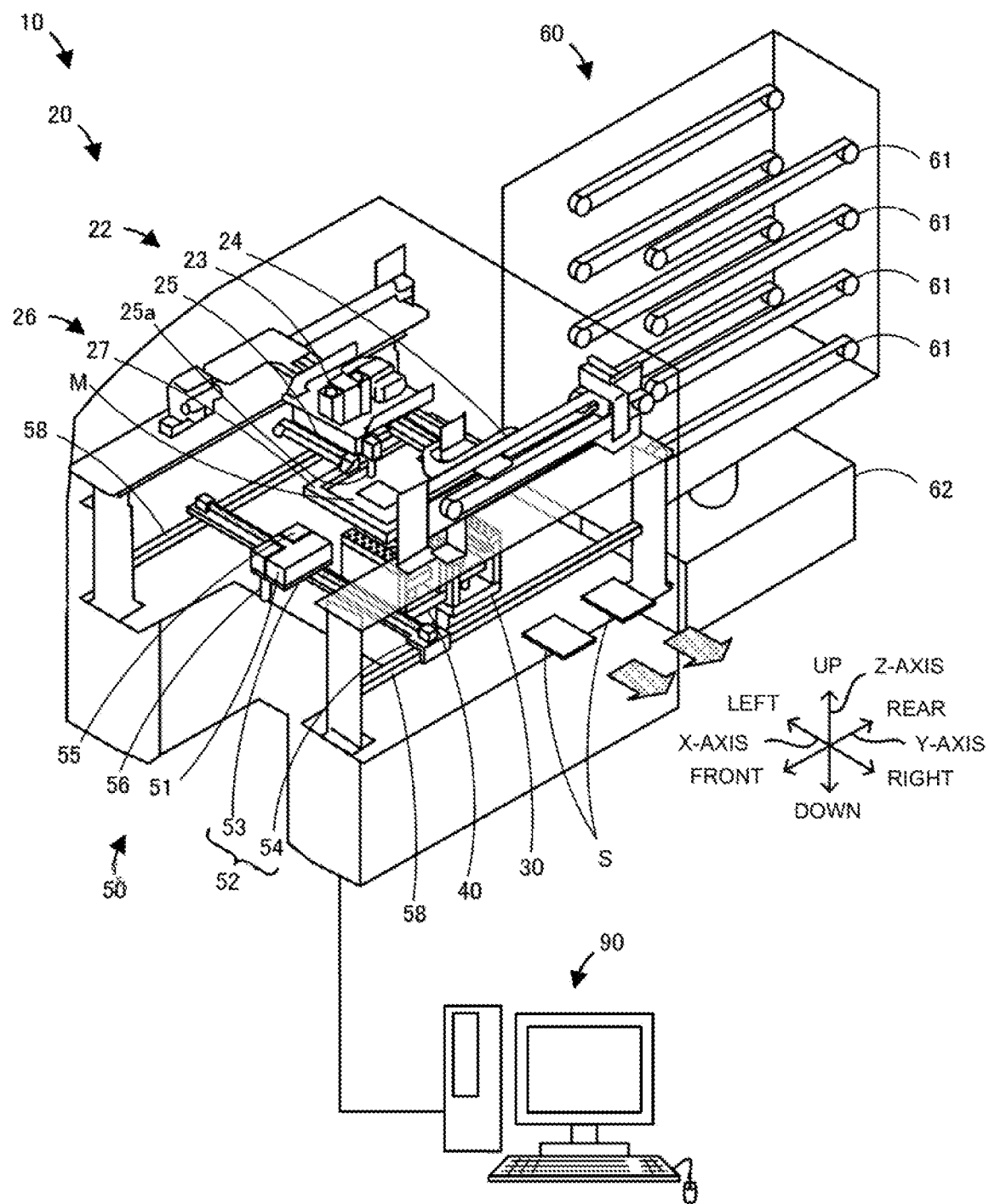
FIG. 1 is a configuration view illustrating an example of a schematic configuration of a mounting system 10.
Figure 2:
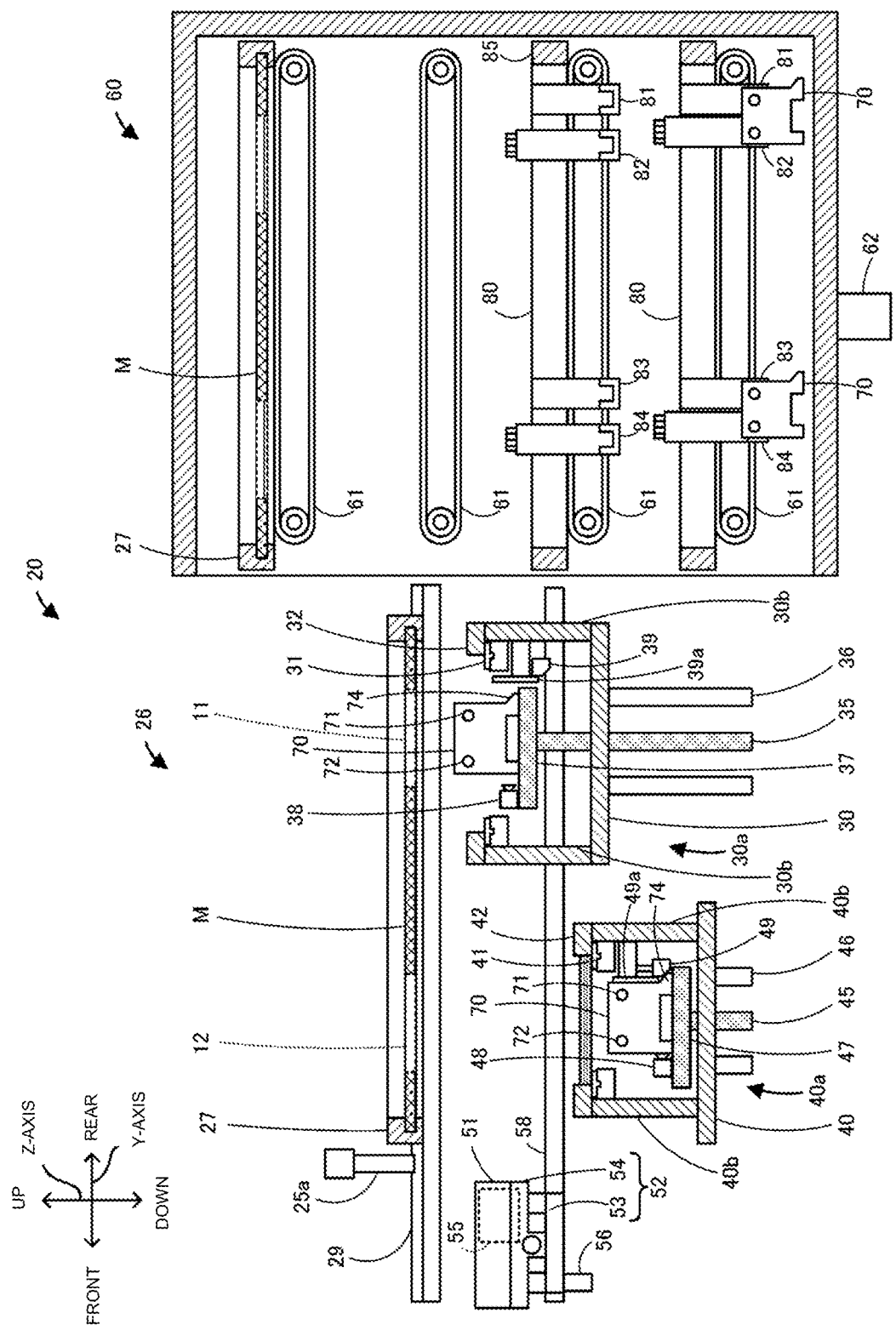
FIG. 2 is an explanatory view illustrating a configuration for performing a printing process and the like of a printing device 20.
Figure 3:
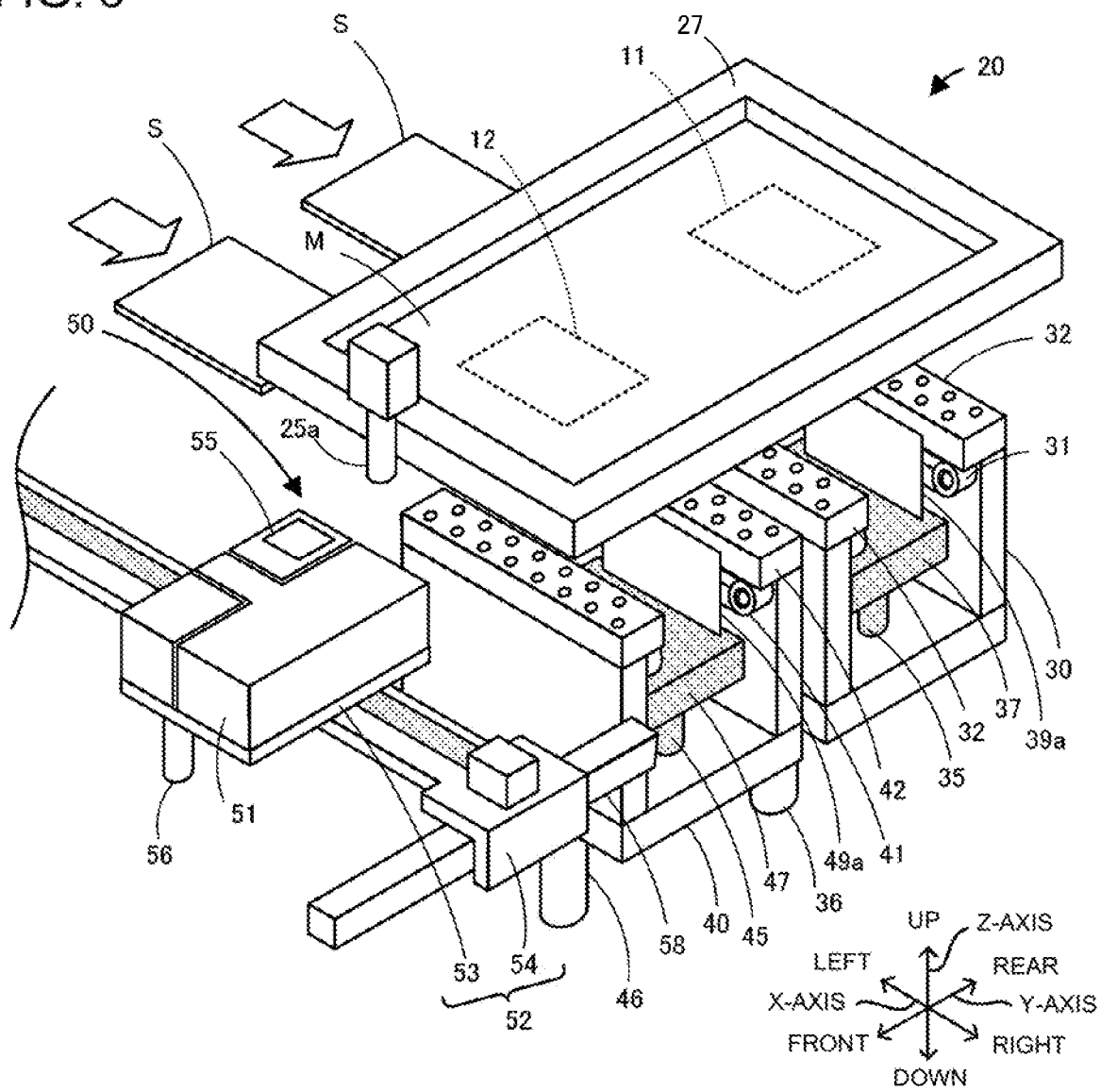
FIG. 3 is a perspective view illustrating a configuration for performing the printing process and the like of the printing device 20.
Figure 4:
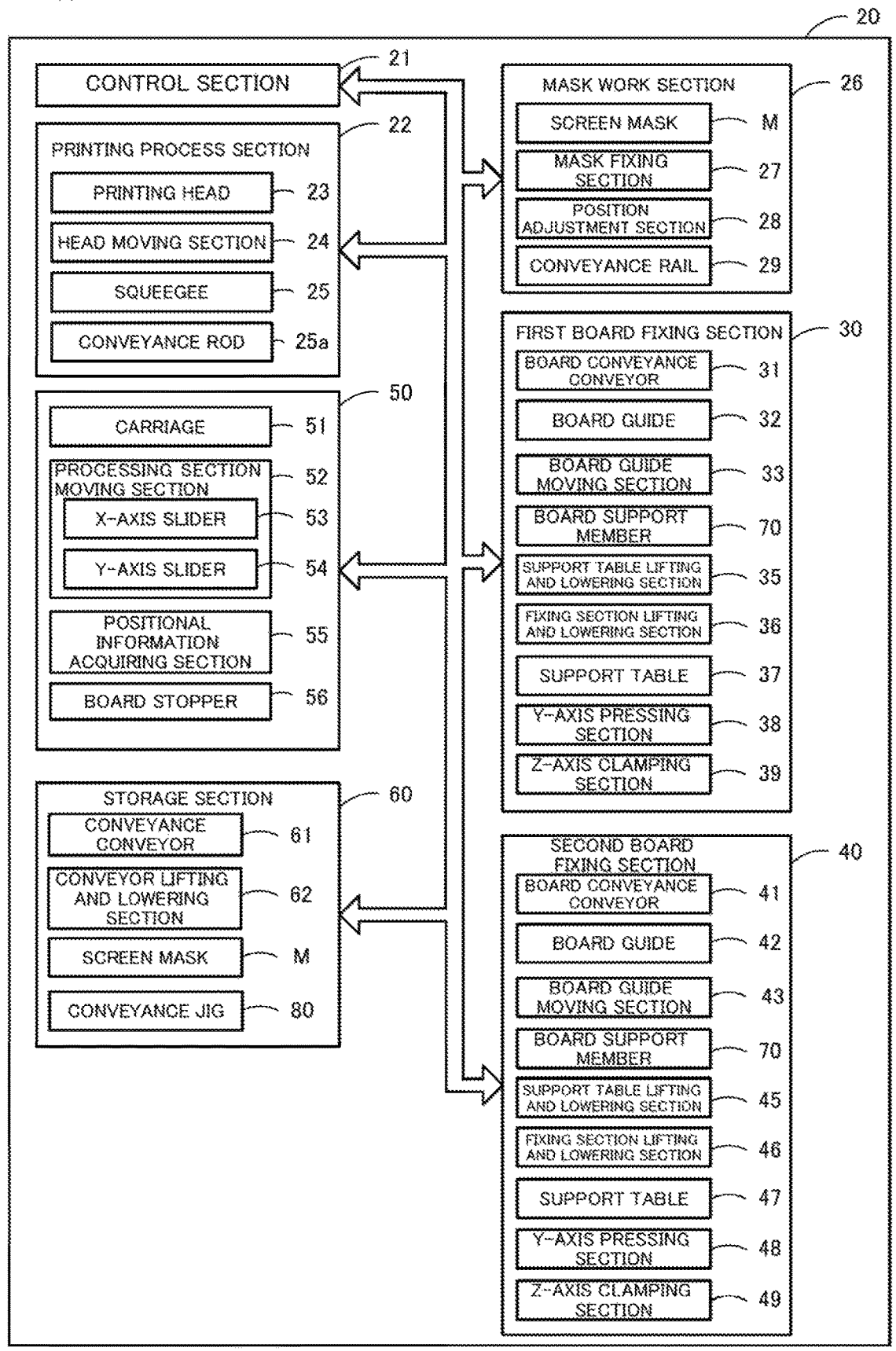
FIG. 4 is a block diagram illustrating an electrical connection relationship of the printing device 20.
Figure 5:
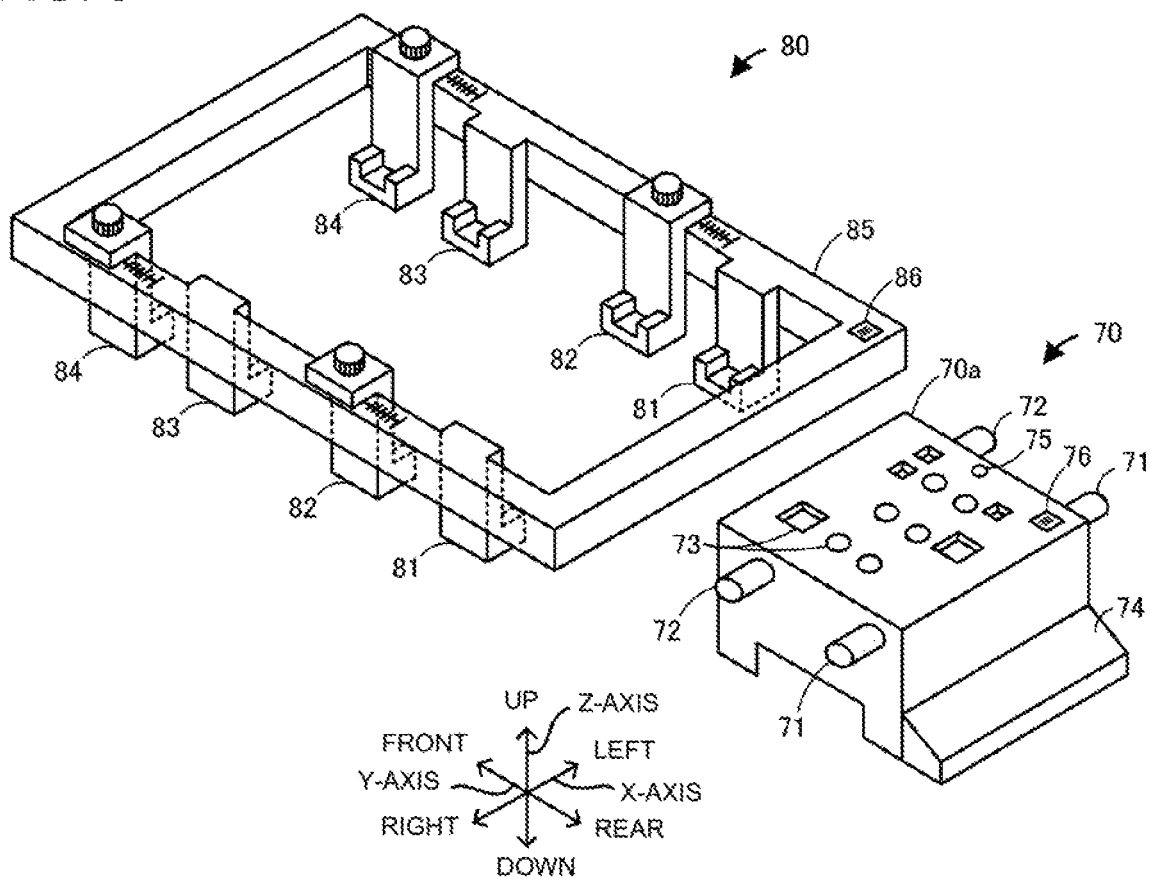
FIG. 5 is a perspective view of a board support member 70 and a conveyance jig 80.

Next, embodiments of the present disclosure will be described with reference to the drawings. FIG. 1 is a configuration view illustrating an example of a schematic configuration of a mounting system 10 according to one embodiment of the present disclosure. FIG. 2 is an explanatory view illustrating a mask work section 26, a first board fixing section 30, a second board fixing section 40, a processing section 50, and a storage section 60, which are configured to perform a printing process, a mask exchange process, and a support member exchange process of a printing device 20. FIG. 3 is a perspective view illustrating the mask work section 26, the first board fixing section 30, the second board fixing section 40, and the processing section 50, which are configured to perform the printing process and the like of the printing device 20. FIG. 4 is a block diagram illustrating an electrical connection relationship of the printing device 20. FIG. 5 is a perspective view illustrating a board support member 70 and a conveyance jig 80. The mounting system 10 includes the printing device 20 which performs a printing process of solder paste as a viscous fluid on aboard S, multiple mounting devices (not illustrated) which mounts electronic components on the board S, and a management computer (PC) 90 which manages information relating to processes by the printing device 20 and the mounting device. Besides the solder paste, examples of viscous fluids include conductive paste, adhesive, or the like. The printing device 20 is configured as a dual lane printing device having two board fixing sections for fixing conveyed boards S. In addition, the printing device 20 is configured as a device by which automatic exchanging of a screen mask M used in the printing process and automatic exchanging in which the conveyance jig 80 of the board support member 70 that supports and fixes the board S is used can be performed, when setup changing which changes the printing target to a different type of board S is performed. In the embodiment, a left-right direction (X-axis), a front-rear direction (Y-axis) and an up-down direction (Z-axis) are as illustrated in FIG. 1 to FIG. 3.

As illustrated in FIG. 1 to FIG. 4, the printing device 20 is a device which applies (prints) solder paste on a lower board S via pattern holes 11 and 12 formed on the screen mask M by the solder on the screen mask M pushing into the pattern holes 11 and 12 thereof by using a squeegee 25. The printing device 20 includes a control section 21, a printing process section 22, the mask work section 26, the first board fixing section 30, the second board fixing section 40, the processing section 50, and the storage section 60. In addition, the printing device 20 includes an operation panel on which a display screen is displayed and thus various input operations are possible by an operator and a communication section that performs communication with a device connected to the LAN.

The control section 21 is configured as a microprocessor centering CPU and includes a ROM that stores process program, a RAM that is used as a work region, an HDD that stores various data, and the like.

The printing process section 22 is disposed on an upper stage of the printing device 20 and is a unit that performs the printing process of a viscous fluid on the board S by using the screen mask M. As illustrated in FIG. 4, the printing process section 22 includes a printing head 23, a head moving section 24, the squeegee 25, and a conveyance rod 25*a*. The printing device 20 includes the printing head 23 which pressurizes and supplies solder paste onto a screen mask M. The head moving section 24 moves the printing head 23 in a predetermined printing direction (front-rear direction) and includes a guide formed in the front-rear direction, a slider which moves along the guide, and a motor which drives the slider. A mechanism which moves the printing head 23 in the up-down direction is also installed in the head moving section 24. The squeegee 25 is installed on the printing head 23 so as to be movable in the up-down direction. The squeegee 25 is a plate-like member elongated in a predetermined direction (X-direction in FIG. 1) and is formed to have a length longer than the pattern holes 11 and 12. A conveyance rod 25*a* is installed on the printing head 23 so as to capable of being lifted and lowered by a motor (not illustrated). The conveyance rod 25*a* pushes and conveys the screen mask M and the conveyance jig 80 in the front and the rear by moving the conveyance rod in the front and the rear by the head moving section 24 in a state of protruding more downward than the squeegee 25.

The mask work section 26 is a unit that is installed between the printing process section 22, the first board fixing section 30 and the second board fixing section 40 and fixes and holds the screen mask M. The screen mask M is, for example, a metal thin plate on which a desired wiring pattern is formed and is fixed to a frame body (mask fixing section 27) with a predetermined tension. In the screen mask M, pattern holes 11 and 12 for forming wiring patterns on the boards S at first and second lanes (first and second board fixing sections 30 and 40) in the printing process are formed, respectively. An identification section (for example, a mark) for position recognition is formed on a lower face of the screen mask M. The mask work section 26 includes a mask fixing section 27, a position adjustment section 28 (see FIG. 4), and a conveyance rail 29 (see FIG. 4). The mask fixing section 27 positions the screen mask M fitted in the frame body to support and fix the screen mask M in a horizontal posture. The position adjustment section 28 adjusts a position the mask fixing section 27 in the XY-directions so that the pattern holes 11 or 12 are disposed at proper positions on the board S fixed to the first board fixing section 30 or the second board fixing section 40. A conveyance rail 29 is a pair of left and right rails extending in the front-rear direction and guides the screen mask M and the conveyance jig 80 so that the screen mask and the conveyance jig 80 pushed by the conveyance rod 25*a* move in the front-rear direction.

The first board fixing section 30 is a unit which is installed below the mask working section 26, introduces the board S, positions and supports the introduced board S, contacts the board S with the screen mask M on which a predetermined wiring pattern is formed, and separates the board S there-from. The first board fixing section 30 constitutes the first lane of the printing process. The first board fixing section 30 includes a board conveyance conveyor 31, a board guide 32, a board guide moving section 33 (see FIG. 4), a support table lifting and lowering section 35, a fixing section lifting and lowering section 36, a support table 37, a Y-axis pressing section 38, and a Z-axis clamping section 39. As illustrated in FIG. 2, the board conveyance conveyor 31 includes a conveyor belt provided on each of a pair of side frames 30b and a belt revolving device which revolves and drives the conveyor belt. In the printing device 20, although not illustrated, an introduction conveyor and a discharge conveyor are installed on an upstream side and the downstream side (left and right sides in FIG. 1) on the board conveyance path of the board conveyance conveyor 31, respectively. The board guide 32 is a plate-like member provided on the upper face of each of the pair of side frames 30b. The board guide moving section 33 is a mechanism which moves the pair of side frames 30b in the front-rear direction to be approached each other and to be separated from each other. Accordingly, the board guide moving section also moves the board guide 32 in the front-rear direction and pinches and fixes the board S in a state where an upper face of the board S and an upper face of the board guide 32 are flush with each other. The support table lifting and lowering section 35 is a mechanism which lifts and lowers the support table 37 with respect to the main body 30a of the first board fixing section 30 and includes a support column which guides the support table 37 in the up-down direction and a driving motor which moves the support column up and down. The support table 37 is a member on which the board support member 70 can be disposed. The board support member 70 is exchanged according to the board S.

The board support member 70 is a member that is disposed on the support table 37, is connected to a decompression device (not illustrated) by a pipe to suck and fix the board S while supporting the board S from a lower face side thereof by a negative pressure. As illustrated in FIG. 5, the board support member 70 includes a main body section 70a, a pair of columnar protruding sections 71 and 71 installed so as to protrude from the left and right of the main body section 70a, a pair of protruding sections 72 and 72 installed forward of the protruding sections 71, multiple suction ports 73 opening on the upper face of the main body section 70a, and a clamped section 74 having an inclined upper face and protruding rearward of the main body section 70a. In addition, the identification section 75 (for example, a mark) for position recognition and a bar code 76 for recognizing the type of the board support member 70 are formed on the upper face of the main body section 70a.

The fixing section lifting and lowering section 36 is a mechanism which lifts and lowers the entire first board fixing section 30 with respect to a device main body and includes a support column which guides the main body of the first board fixing section 30 in the up-down direction and supports the main body of the first board fixing section and a driving motor which moves the support column up and down. The Y-axis pressing section 38 (see FIG. 2) is a mechanism used for the positioning of the board support member 70 and is installed on the support table 37. The Y-axis pressing section 38 includes a block-shaped main body which is movable in the front-rear direction and presses and moves the board support member 70 rearward and a driving mechanism such as a cylinder (not illustrated) which moves the main body forward and rearward. In addition, the Y-axis pressing section 38 also serves as a mechanism for supplying a negative pressure to the board support member 70 and a suction port connected to the decompression device (not illustrated) by a pipe is installed rearward of the main body. By the main body of the Y-axis pressing section 38 being pressed against the board support member 70, a path is connected from the decompression device to the suction port 73, and a negative pressure is supplied to the suction port 73. The Z-axis clamping section 39 is a mechanism used for fixing the board support member 70 and is installed on the rear side frame 30b. The Z-axis clamping section 39 includes a block-shaped main body which can move in the up-down direction and a driving mechanism such as a cylinder for moving the main body up and down. The main body of the Z-axis clamping section 39 having moved downward pinches the clamped section 74 of the board support member 70 along with the support table 37 to fix the board support member 70. In addition, a support plate 39a is installed in the up-down and left-right directions forward of the Z-axis clamping section 39. When the side frame 30b moves in the front and the rear by the board guide moving section 33, the Z-axis clamping section 39 and the support plate 39a also move in the front and the rear, so that the fixing position of the board support member 70 in the front-rear direction can be changed.

The second board fixing section 40 is a unit which is juxtaposed to the first board fixing section 30 and conveys and fixes the board S like the first board fixing section 30. The second board fixing section 40 constitutes the second lane of the printing process. The second board fixing section 40 has a main body 40a and a side frame 40b and includes a board conveyance conveyor 41, a board guide 42, a board guide moving section 43, a support table lifting and lowering section 45, a fixing section lifting and lowering section 46, a support table 47, a Y-axis pressing section 48, and a Z-axis clamping section 49. In addition, the board support member 70 can be disposed on the support table 47. The description of the second board fixing section 40 is omitted since the basic configuration thereof is the same as that of the first board fixing section 30. The printing device 20 is configured to include two board conveyance devices which are the first board fixing section 30 and the second board fixing section 40 and one mask work section 26.

The processing section 50 is a unit which performs imaging process of imaging the identification section (for example, a mark and a notch, unevenness, a character, or the like) or the like for position recognition formed on the board S. The processing section 50 includes a carriage 51, a processing section moving section 52, and a positional information acquiring section 55. In addition, the processing section 50 includes a board stopper 56 for stopping the board S conveyed in the right direction by the board conveyance conveyor 31 and 41 at a predetermined position in the left-right direction. The positional information acquiring section 55 and the board stopper 56 are installed on the carriage 51 and the carriage 51 moves in the XY-directions by the processing section moving section 52. The processing section moving section 52 includes an X-axis slider 53 and a Y-axis slider 54. The Y-axis slider 54 is a plate-like member whose longitudinal direction is set as the X-axis direction and is moved along a support rail 58 formed on the device in the Y-axis direction (front-rear direction) by a moving motor. The carriage 51 is installed on the X-axis slider 53 and the X-axis slider moves along a guide formed on the Y-axis slider 54 in the X-axis direction by the moving motor. The processing section 50 moves to any one of a region (also referred to as a first region) of the first board fixing section 30 which is the first lane, a region (also referred to as a second region) of the second board fixing section 40 which is the second lane, and a retraction region (see FIG. 1 to FIG. 3) deviated from the regions. The positional information acquiring section 55 is a unit which can image an identification section formed on the board S, an identification section formed on the lower face of the screen mask M, and an identification section 75 of the board support member 70 and acquires positional information thereof by imaging. The lower face side and the upper face side of the positional information acquiring section 55 are imaging regions. The board stopper 56 is, for example, a rod-like member and is installed on the carriage 51 so as to be capable of lifting and lowering by a motor (not illustrated). The board stopper 56 abuts against the board S conveyed above the board support member 70 by the board conveyance conveyors 31 and 41 to stop the boards S by being in a state where the board stopper 56 protrudes below the support rail 58 above the first and the second board fixing sections 30 and 40.

The storage section 60 is installed rearward the main body of the printing device 20 and is a mechanism which stores members to be exchanged (to be introduced and to be discharged) during an automatic exchanging of the screen mask M or the board support member 70. The storage section 60 includes a storage box with front opening and a conveyor lifting and lowering section 62 which lifts and lowers the storage box. Multiple stages (four stages in the embodiment) of a pair of conveyance conveyors 61 which convey the placed objects in the front-rear direction are installed in the storage box. The screen mask M to be introduced into the mask work section 26, a conveyance jig 80 to which the board support members 70 to be introduced into the first and/or the second board fixing sections 30 and/or 40 is attached, and the conveyance jig 80 to which the board support members 70 to be discharged from the first and/or the second board fixing sections 30 and/or 40 is to be attached are stored in three stages of the four stages of conveyance conveyors 61 in advance by the operator. In addition, the remaining one stage of conveyance conveyor 61 is emptied so as to store the screen mask M to be discharged from the mask work section 26. The conveyor lifting and lowering section 62 makes the upper face of any conveyance conveyor 61 the same height as the upper face of the conveyance rail 29 and, in the state, the conveyance conveyor 61 is operated so that the storage section 60 introduces a member placed on the conveyance conveyor 61 into the mask work section 26 or discharges a member from the mask work section 26.

The conveyance jig 80 is a member being capable of conveying the board support member 70 by using the conveyance conveyor 61 and the conveyance rod 25a. As illustrated in FIG. 5, the conveyance jig 80 has first to fourth protrusion holding sections 81 to 84 installed in this order inside the frame body 85 from the rear toward the front. Each pair of the first to fourth protrusion holding sections 81 to 84 is installed in the left-right direction, respectively and are installed at a tip of an arm section extending downward from the frame body 85. As illustrated in FIG. 2, the conveyance jig 80 can attach one board support members 70 thereto by the first and the second protrusion holding sections 81 and 82 and can attach one support member 70 thereto by the third and fourth protrusion holding sections 83 and 84. Recessed sections slightly larger than an outer diameter of the protruding sections 71 or the protruding sections 72 of the board support member 70 are formed on the upper faces of the first to fourth protrusion holding sections 81 to 84. By the protruding sections 71 and 72 being placed on the recessed section, the conveyance jig 80 can convey while fixing the position of the board support member 70 in the front-rear direction. Although there are plural types of board support members 70 according to the type of board S to be supported, in both cases, the outer diameters of the protruding sections 71 and 72 are the same. In addition, the positions of the second protrusion holding sections 82 and the fourth protrusion holding sections 84 in the front-rear direction can be adjusted and, according to this, multiple types of board support members 70 having different sizes (distances between protruding sections 71 and protruding sections 72) can be attached thereto. The conveyance jig 80 has substantially the same width in the left-right direction as that of the mask fixing section 27 of the screen mask M. Accordingly, the conveyance jig 80 can be conveyed along the same conveyance rail 29 as the screen mask M. In addition, since the same storage section 60 can be used for the conveyance jig 80 and the screen mask M, it is preferable that the length of the conveyance jig 80 and the screen mask M in the front-rear direction be close to each other. Multiple types of frame bodies 85 or protrusion holding sections having different sizes or the like may be present in the conveyance jig 80 and a bar code 86 for type recognition of the conveyance jig 80 is attached to the upper face of the frame body 85.

Figure 6:
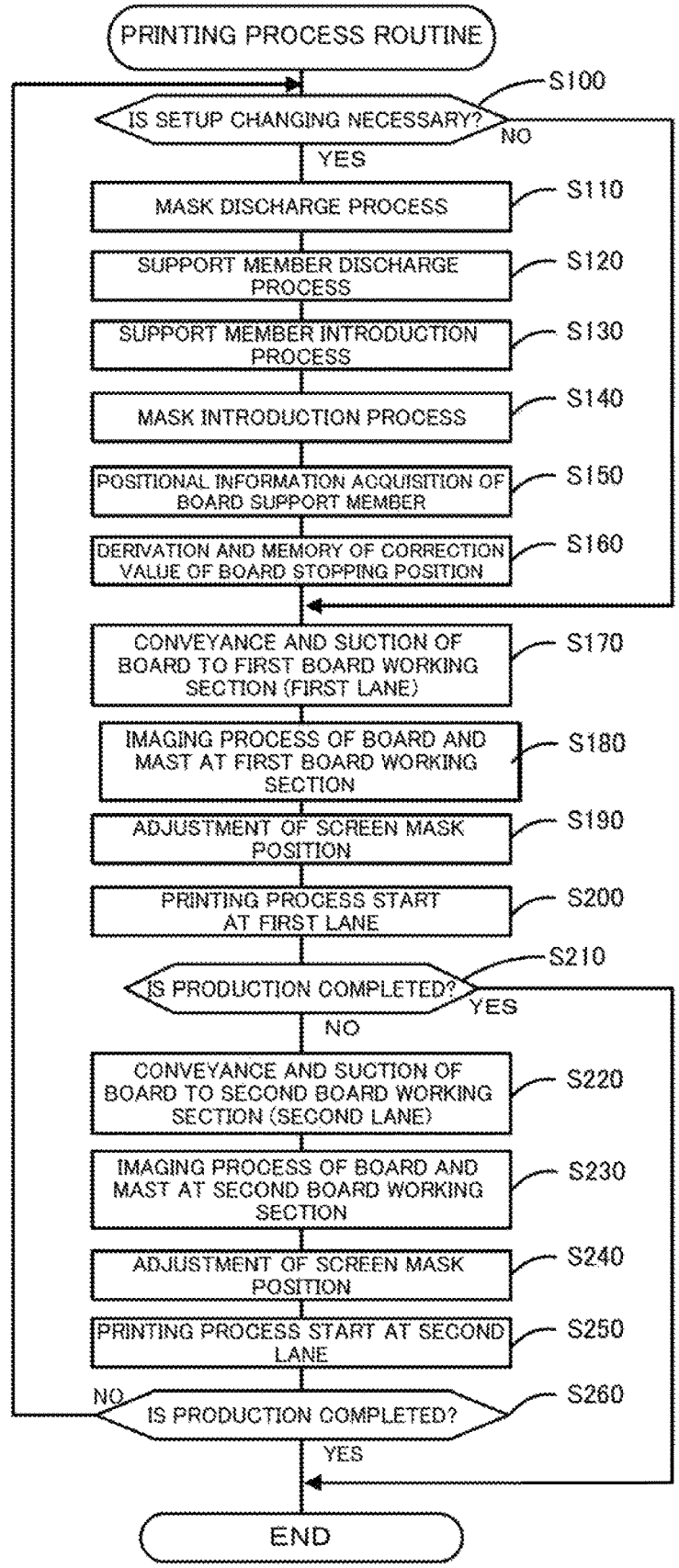
FIG. 6 is a flowchart illustrating an example of a printing process routine.
Figure 7:
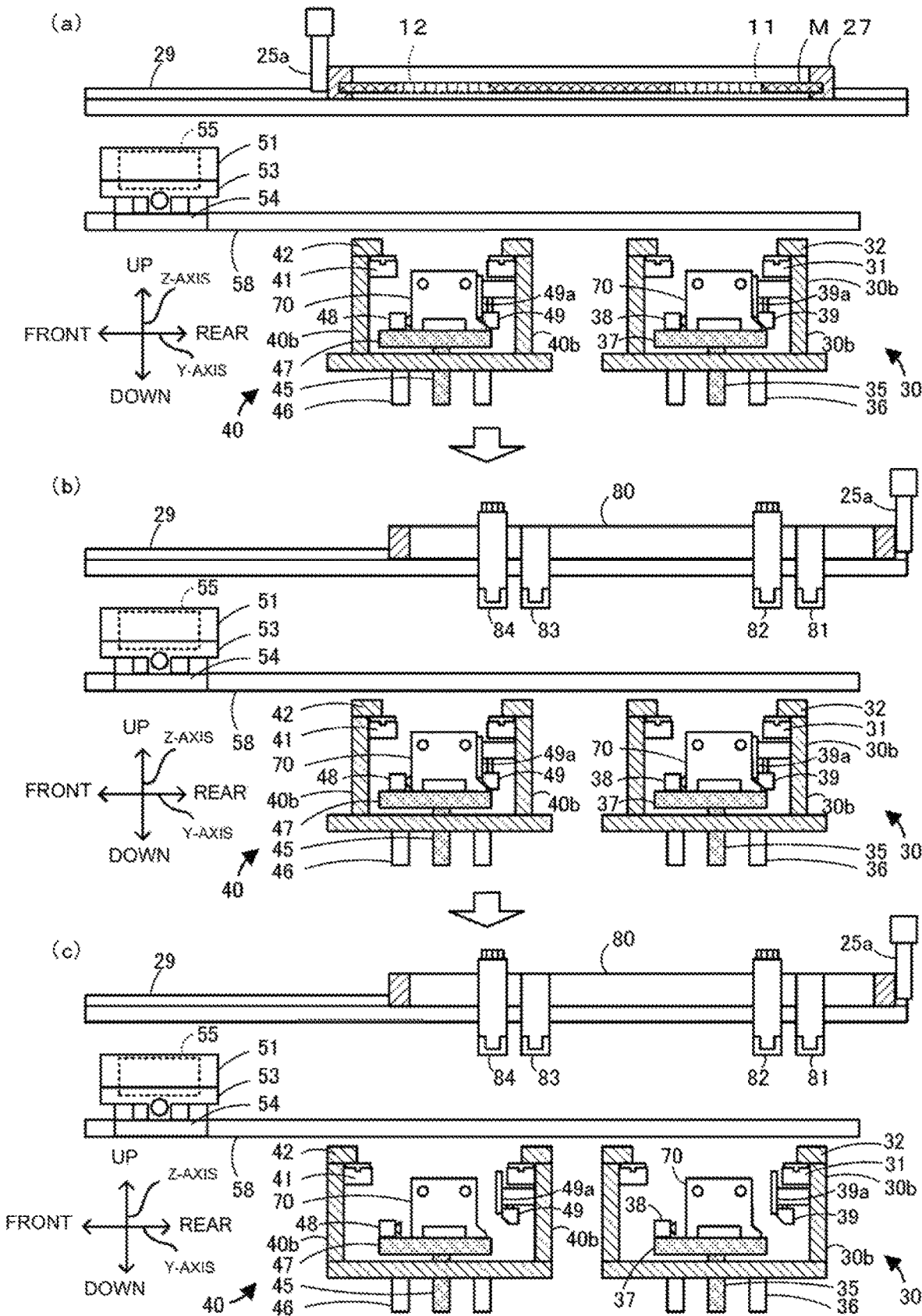
FIG. 7 is an explanatory view illustrating a state of an exchange process of a screen mask M and the board support members 70.
Figure 8:
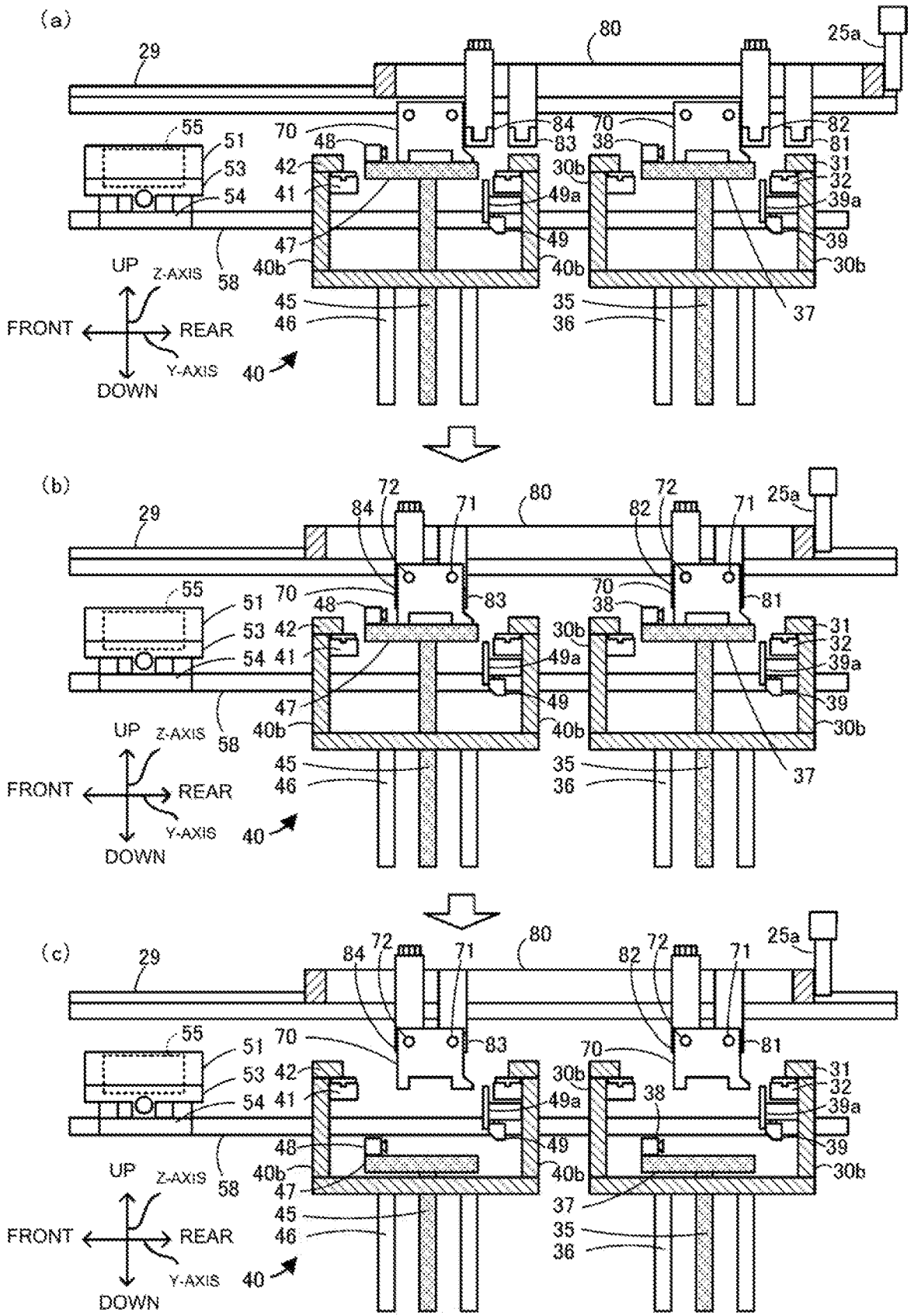
FIG. 8 is an explanatory view illustrating a state of the exchange process of the screen mask M and the board support members 70.
Figure 9:
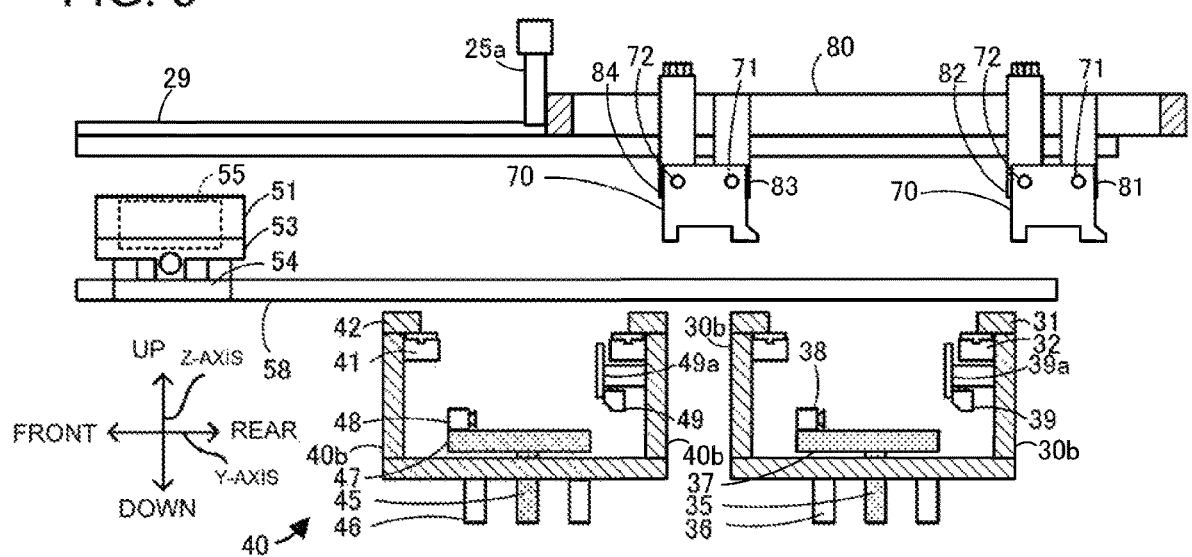
FIG. 9 is an explanatory view illustrating a state of the exchange process of the screen mask M and the board support members 70.
Figure 10:
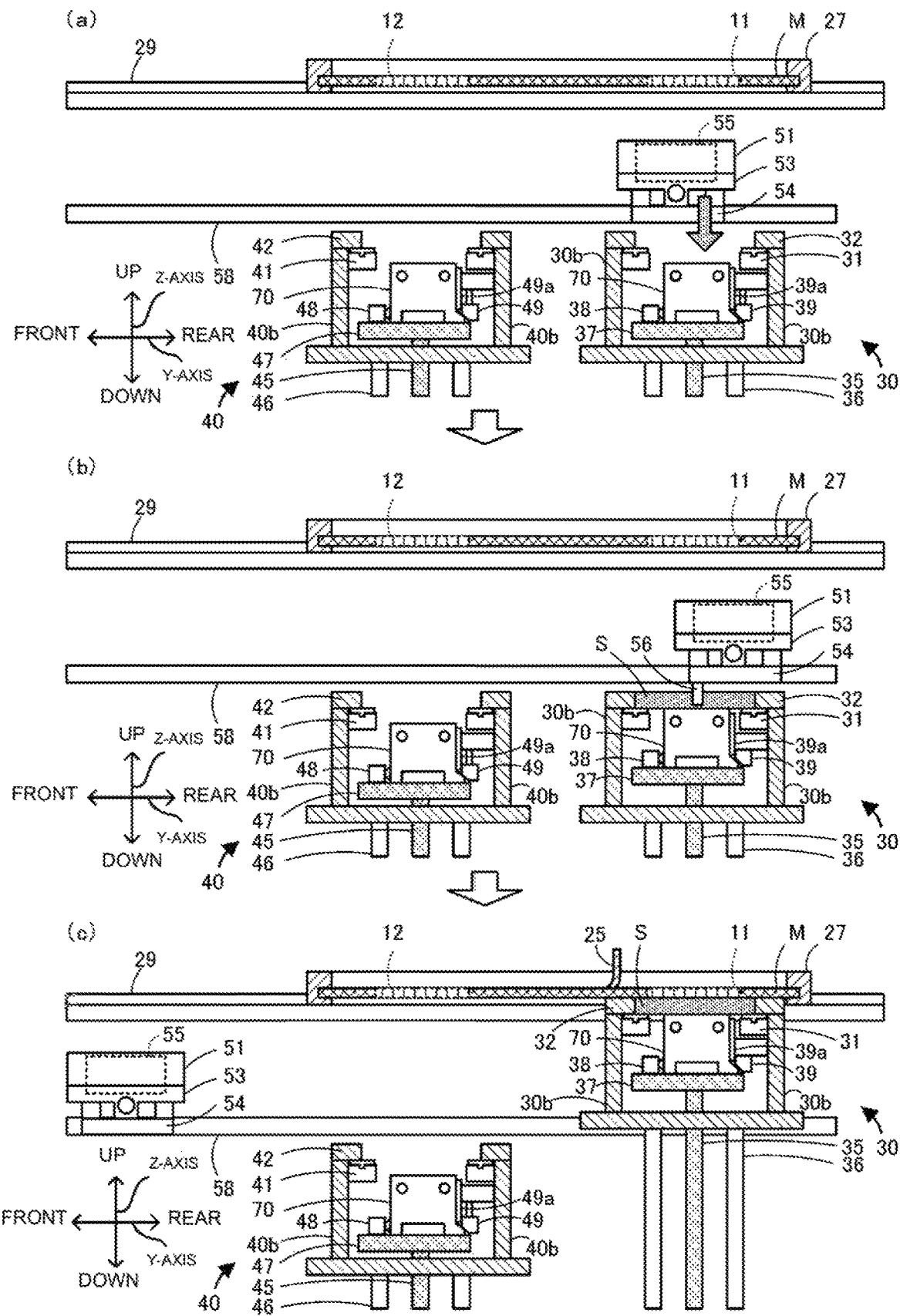
FIG. 10 is an explanatory view illustrating conveyance, suction, and a printing process of a board S.

Next, a process of performing the printing process on the board S by the printing device 20 while the printing device 20 performs the automatic exchanging of the screen mask M and the board support member 70 will be described. FIG. 6 is a flowchart illustrating an example of a printing process routine performed by the CPU of the control section 21. FIG. 7 to FIG. 9 are explanatory views illustrating states of the exchange processes of the screen mask M or the board support members 70. FIG. 10 is an explanatory view illustrating the conveyance, suction, and printing process of the board S.

The printing process routine is stored in the HDD of the control section 21 and is performed after the operator instructs the printing device 20 for the printing process. When the printing process routine is performed, the CPU of the control section 21 first determines whether or not the exchange processes of the screen mask M present in the mask work section 26 and the board support members 70 present in the first and the second board fixing sections 30 and 40, that is, the setup changing is necessary (step S100). The control section 21 determines whether or not it is necessary to change the setup depending on whether or not the screen mask M or the board support member 70 necessary for the printing process are different between the previous time and the current time based on information relating to the printing process acquired from the management PC 90. As illustrated in FIG. 2, in a case where the setup change is necessary, a screen mask M to be introduced, a conveyance jig 80 to which the board support members 70 to be introduced are attached, and the conveyance jig 80 for attaching the board support members 70 to be discharged thereto are stored in the storage section 60 in advance by the operator. The operator reads the bar code 76 or the bar code 86 using a bar code reader as necessary to perform matching whether or not the correct member is stored in the storage section 60. In addition, the operator adjusts the positions of the second protrusion holding sections 82 and the fourth protrusion holding sections 84 in the front-rear direction in advance with respect to the conveyance jig 80 for attaching the board support members 70 to be discharged thereto.

In a case where the setup change is necessary in step S100, the control section 21 performs the mask discharge process of discharging the screen mask M to be discharged from the mask work section 26 (step S110). The control section 21 moves the conveyance rod 25a to convey the screen mask M to be discharged present in the mask work section 26 rearward while sliding the screen mask M against the conveyance rail 29 as illustrated in FIG. 7(a). In addition, by controlling the conveyor lifting and lowering section 62 and the conveyance conveyor 61, the screen mask M to be discharged is placed on the vacant conveyance conveyor 61. Since it is necessary to discharge the screen mask M in the mask work section 26 once so as to perform the exchange process of the board support member 70, the control section 21 performs the discharge process of the screen mask M even in a case where the screen mask M is not to be exchanged.

Subsequently, the control section 21 performs a support member discharge process of discharging the board support members 70 to be discharged from the first and the second board fixing sections 30 and 40 (step S120). First, the control section 21 controls the conveyor lifting and lowering section 62 and the conveyance conveyor 61 to introduce the empty conveyance jig 80 onto the conveyance rail 29 and further moves the conveyance rod 25a forward to convey the conveyance jig 80 above the first and the second board fixing sections 30 and 40 (FIG. 7(b)). At this time, the control section 21 is set so that the first to fourth protrusion holding sections 81 to 84 are positioned to be deviated in the front-rear direction (for example, rearward) from directly above the protruding sections 71 and 72 of the board support members 70. Subsequently, the control section 21 releases the fixing of the board support members 70 on the support tables 37 and 47. Specifically, the control section 21 moves the Y-axis pressing sections 38 and 48 forward, moves the Z-axis clamping sections 39 and 49 upward, and separates the pair of side frames 30b and 40b in the front and the rear by the board guide moving sections 33 and 43 (FIG. 7(c)). Next, the control section 21 lifts the board support members 70 on the support tables 37 and 47 by the support table lifting and lowering sections 35 and 45 and the fixing section lifting and lowering sections 36 and 46, respectively (FIG. 8(a)). Accordingly, the protruding sections 71 and 72 of the board support members 70 are lifted above the first to fourth protrusion holding sections 81 to 84. Subsequently, the control section 21 moves the conveyance jig 80 forward by the conveyance rod 25a so that the first and the second protrusion holding sections 81 and 82 are positioned directly below the protruding sections 71 and 72 of the board support member 70 on the support table 37 and the third and fourth protrusion holding sections 83 and 84 are positioned directly below the protruding sections 71 and 72 of the board support member 70 on the support table 47 (FIG. 8(b)). The control section 21 lowers the support tables 37 and 47. Accordingly, the two board support members 70 are in a state where the protruding sections 71 and 72 are held on the first to fourth protrusion holding sections 81 to 84 and are in a state of being attached to the conveyance jig 80 (FIG. 8(c)). Thereafter, the control section 21 lowers the entire first and second board fixing sections 30 and 40 by the fixing section lifting and lowering sections 36 and 46 to move the conveyance jig 80 to which the two board support members 70 to be discharged are attached rearward by the conveyance rod 25a (FIG. 9). The control section 21 places the conveyance jig 80 to which the board support members 70 are attached to the conveyance conveyor 61 which is empty as it is. As described above, the control section 21 combines the conveyance of the conveyance jig 80 in the front and the rear and the lifting and lowering of the support tables 37 and 47 to perform the support member discharge process of the board support members 70.

After the support member discharge process of step S120, the control section 21 performs a support member introduction process of introducing the board support members 70 to be introduced into the first and the second board fixing sections 30 and 40 (step S130). The process can be performed in the reverse order of the support member discharge process described above. In other words, first, the control section 21 conveys the conveyance jig 80 to which the two board support members 70 to be introduced are attached forward (FIG. 9), conveys the board support members 70 above the support tables 37 and 47 (FIG. 8(c)), and lifts the support tables 37 and 47 to float the protruding sections 71 and 72 from the first to fourth protrusion holding sections 81 to 84 (FIG. 8(b)). Subsequently, the control section 21 moves the conveyance jig 80 rearward (FIG. 8(a)) and then lowers the support tables 37 and 47 (FIG. 7(c)). Next, the control section 21 moves the conveyance jig 80 rearward to discharge the conveyance jig 80 and positions and fixes the board support members 70 onto the support tables 37 and 47 (FIG. 7(b)). Specifically, first, the control section 21 causes the pair of side frames 30b and 40b to approach each other in the front and the rear by the board guide moving sections 33 and 43 and to move the support plates 39a and 49a to a predetermined position. A position in which the support plates 39a and 49a are moved in the front-rear direction is predetermined according to the type of the board S to be printed or the type of the board support member 70, and the like in advance and is acquired from the management PC 90, for example. Subsequently, the control section 21 moves the Y-axis pressing sections 38 and 48 rearward to move the board support members 70 on the support tables 37 and 47 rearward until the board support members are abutted against the support plates 39a and 49a, respectively. Accordingly, by moving the support plates 39a and 49a and the Y-axis pressing sections 38 and 48 in the front and the rear, even if the position of the board support member 70 detached from the conveyance jig 80 deviates in the front and the rear, the board support member 70 can be positioned in a suitable position. When the board support members 70 are abutted against the support plates 39a and 49a, respectively, the control section 21 moves the Z-axis clamping sections 39 and 49 downward to press the clamped section 74 and to fix the position of the board support members 70 on the support tables 37 and 47. As described above, the control section 21 combines conveyance of the conveyance jig 80 in the front and the rear and the lifting and lowering of the support tables 37 and 47 to perform the support member introduction process of the board support members 70. In addition, the control section 21 performs positioning of the board support members 70 in the front-rear direction.

After the support member discharge process of step S130, the control section 21 performs a mask introduction process of introducing the screen mask M into the mask work section 26 (step S140). The control section 21 performs the process in the reverse order of the mask discharge process. In other words, the control section 21 first controls the conveyor lifting and lowering section 62 and the conveyance conveyor 61 to convey the screen mask M to be conveyed to the conveyance rail 29, and moves the screen mask M forward by the conveyance rod 25a to introduce the screen mask into the mask work section 26. In a case where the screen mask M is not to be exchanged, the screen mask M discharged in the mask discharge process is introduced.

When the exchange process of the screen mask M and the board support members 70 is ended by performing the process of steps S110 to S140, the control section 21 acquires positional information of the introduced board support member 70 in the left-right direction (step S150), and determines the correction value of the stopping position of the board S based on the acquired positional information (step S160). The control section 21 moves the carriage 51 above the support table 37 as illustrated in FIG. 10(*a*) and causes the positional information acquiring section 55 to image the identification section 75 on the upper face of the board support member 70. Based on the position of the identification section 75 in the image acquired from the positional information acquiring section 55, the control section 21 obtains the positional deviation of the board support member 70 on the support table 37 in the left-right direction (conveyance direction of board S), derives a correction value of the stopping position at the time of conveying the board S to store the correction value in the RAM or the like. Here, if the board support member 70 deviates in the conveyance direction of the board S on the support table 37, there is a case where a problem occurs in suction fixing of the board S depending on the stopping position of the board S. In a case where the position of the board support member 70 deviates in the left-right direction, the control section 21 also corrects the stopping position of the board S by the deviated amount so that the positional relationship between the board support member 70 and the board S is unchanged. The control section 21 similarly performs acquisition of positional information and derivation of the correction value for the board support member 70 on the support table 47.

After step S160 or in a case where it is unnecessary to change the setup in step S100, the control section 21 drives the board conveyance conveyor 31 to convey the board S to the first board fixing section 30 (first lane) to suck the board S to the board support member 70 (step S170). When the board S is conveyed to the first board fixing section 30, the control section 21 moves the carriage 51 in the front and the rear, and in the left and the right and lowers the board stopper 56 so that the board S conveyed to left and right is stopped at a predetermined stopping position on the board support member 70 (FIG. 10(*b*)). At this time, when there is the correction value derived in step S160, the board stopper 56 is moved to the position where the correction value is added. In addition, the control section 21 lifts the support table 37 to abut the upper face of the board support member 70 against the lower face of the stopped board S and to suck and fix the board S by a negative pressure from the decompression device.

Subsequently, the control section 21 performs an imaging process of the identification sections of the board S and the screen mask M by the positional information acquiring section 55 (step S180), and the positions of the board S and the pattern holes 11 of the screen mask M are adjusted so as to be in the proper position based on the obtained image (step S190). The control section 21 starts printing on the first board fixing section 30 (step S200, FIG. 10(*c*)). The control section 21 lifts the first board fixing section 30 so as to be abutted against the upper face of the board S and the lower face of the screen mask M. The printing head 23 is moved onto the screen mask M on the first lane side, the solder paste is pressurized and discharged from the printing head 23, the squeegee 25 is moved in the front and the rear to print the solder paste on the board S.

After the printing process at the first board fixing section 30, the control section 21 determines whether or not the production process is completed based on whether or not there is the board S on which to print next (step S210). When the production process is not completed, the conveyance of the board S, the positional adjustment of the screen mask M, the printing process, or the like is performed by using the second board fixing section 40 (steps S220 to S250). Since the process is the same as the process (steps S170 to S200) in the first board fixing section 30 described above, a detailed description thereof will be omitted. After step S250, the control section 21 determines whether or not the production is completed (step S260) and when the production is not completed, the control section 21 performs the process of shifting to step S100. In other words, while performing the setup change if necessary, the printing process on the boards S fixed to the first and the second board fixing sections 30 and 40 is sequentially performed. When the production process is completed in step S210 or S260, the control section 21 ends the present routine.

Here, the correspondence relationship between the constituent elements of the embodiment and the constituent elements of the disclosure will be clarified. The conveyance rod 25*a* of the embodiment corresponds to a support member conveyance section of the disclosure and the control section 21 corresponds to an exchange control section. In addition, the first and the second board fixing sections 30 and 40 correspond to the board fixing section, the Y-axis pressing sections 38 and 48, the board guide moving sections 33 and 43, and the support plates 39*a* and 49*a* correspond to the positioning section, the board conveyance conveyors 31 and 41 correspond to the board conveyance section, the positional information acquiring section 55 corresponds to the positional information acquiring section, the control section 21 and the board stopper 56 correspond to the correction section, the support tables 37 and 47 correspond to the support table, the support table lifting and lowering sections 35 and 45 and the fixing section lifting and lowering sections 36 and 46 correspond to the support member lifting and lowering section, and the conveyance jig 80 corresponds to the conveyance jig.

The printing device 20 according to the embodiment described in detail above includes a support member conveyance section (conveyance rod 25*a*) for discharging and introducing the screen mask M and the board support member 70. In the printing device 20, using this conveyance rod 25*a*, the support member exchange process (steps S120 and S130) including the discharge and the introduction of the board support member 70 can be performed and the automatic exchanging of the board support member 70 can be performed. In addition, using the conveyance rod 25*a*, the printing device 20 can also perform a mask exchange process (steps S110 and S140) for performing the discharge and the introduction of the screen mask M. In other words, automatic exchanging of the board support member 70 and automatic exchanging of the screen mask M can be performed using the same conveyance rod 25*a*. Therefore, for example, the configuration of the device can be made more compact compared to a case where the printing device 20 separately includes the conveyance section for exchanging the screen mask and the conveyance section for exchanging the board support member.

In addition, the board support member 70 can be disposed on the printing device 20, and the printing device 20 includes the first and/or the second board fixing sections 30 and/or 40 which fix the board S by the disposed board support member 70 when the printing process is performed, the positioning sections (Y-axis pressing sections 38 and/or 48, board guide moving sections 33 and/or 43, and supporting plates 39a and/or 49a) which perform the positioning of the board support member 70 in the horizontal direction by moving the board support member 70 disposed on the first and/or the second board fixing sections 30 and/or 40. In the support member introduction process, the control section 21 controls the conveyance rod 25a to convey the board support member 70 to be introduced to the first and/or the second board fixing sections 30 and/or 40 and controls the Y-axis pressing sections 38 and/or 48, the board guide moving sections 33 and/or 43, and the support plates 39a and/or 49a to perform the positioning of the conveyed board support member in the front-rear direction. Therefore, positional deviation can be suppressed in the first and/or the second board fixing sections 30 and/or 40 of the board support member 70 conveyed in the support member introduction process in the front-rear direction.

Further, the printing device 20 includes the first and/or the second board fixing sections 30 and/or 40, the board conveyance conveyors 31 and/or 41 which convey the board S in a predetermined board conveyance direction (left-right direction), and a positional information acquiring section 55 which acquires positional information on the position of the board support member 70 disposed on the first and/or the second board fixing sections 30 and/or 40 in the board conveyance direction. The printing device 20 includes the correction section (control section 21 and board stopper 56) which corrects the stopping position on the board support member 70 based on the acquired positional information when the board conveyance conveyor 31 and/or 41 convey the board S. Accordingly, even in a case where the position of the board support member 70 conveyed in the first and/or the second board fixing sections 30 and/or 40 in the support member introduction process is deviated in the board conveyance direction, the stopping position of the board S can be corrected based on the positional information. Therefore, the occurrence of problems in fixing the board S by the board support member 70 can be suppressed.

Furthermore, the printing device 20 has the support tables 37 and/or 47 on which the board support member 70 can be disposed and includes the first and/or the second board fixing sections 30 and/or 40 which fix the board S by the disposed board support member 70 when the printing process is performed, the support table lifting and lowering sections 35 and/or 45 which lift and lower the board support member 70 disposed on the support tables 37 and/or 47 by lifting and lowering the support tables 37 and/or 47, and the fixing section lifting and lowering sections 36 and/or 46. The conveyance rod 25a discharges and introduces a conveyance jig 80 to which the board support member 70 can be attached, and in a support member discharge process, the control section 21 controls the conveyance rod 25a, the support table lifting and lowering sections 35 and/or 45, and the fixing section lifting and lowering sections 36 and/or 46 to convey the conveyance jig 80 above the first and/or the second board fixing sections 30 and/or 40, to lift the board support member 70 to be discharged disposed on the support tables 37 and/or 47, to be attached to the conveyance jig 80, and to perform the process of discharging conveyance jig 80 after the attachment. In addition, in the support member introduction process, the control section 21 controls the conveyance rod 25a, the support table lifting and lowering sections 35 and/or 45, and the fixing section lifting and lowering sections 36 and/or 46 to convey the conveyance jig 80 to which the board support member 70 to be introduced is attached above the first and/or the second board fixing sections 30 and/or 40 and lifts the support tables 37 and/or 47 to detach the board support member 70 to be introduced from the conveyance jig 80, to dispose the board support member on the support tables 37 and/or 47, and to perform the process of discharging the conveyance jig 80 after the detachment. Accordingly, even in a case where the shape or size of the board support member 70 is not suitable for conveyance by the conveyance rod 25a, for example, the support member exchange process can be performed by conveying the board support member 70 by using the conveyance jig 80. In the printing device 20 of the present embodiment, although the conveyance rod 25a conveys the screen mask M and the board support member 70 together, since the width of the board support member 70 in the left-right direction is smaller than that of the screen mask M, the board support member 70 cannot be conveyed directly by the conveyance rod 25a by sliding on the conveyance rail 29. In a case where the shapes or sizes of the screen mask M and the board support member 70 are different from each other as described above, it is meaningful to use the conveyance jig 80.

Furthermore, the printing device 20 has the first board fixing section 30 and the second board fixing section 40 as a board fixing section and has the first support member lifting and lowering section (support table lifting and lowering section 35 and fixing section lifting and lowering section 36) which lifts and lowers the support table 37 and the second support member lifting and lowering section (support table lifting and lowering section 45 and fixing section lifting and lowering section 46) which lifts and lowers the support table 47, as a support member lifting and lowering section. In addition, the conveyance rod 25a discharges and introduces the conveyance jig 80 which can attach multiple the board support members 70 thereto. In the support member discharge process, the control section 21 controls the conveyance rod 25a, the support table lifting and lowering sections 35 and 45, and the fixing section lifting and lowering sections 36 and 46 to introduce the conveyance jig 80, to lift each of the board support members 70 to be discharged disposed on the support tables 37 and 47, to attach the board support members to the conveyance jig 80, and to perform the process of conveying the conveyance jig 80 after the attachment. In addition, in the support member introduction process, the control section 21 controls the conveyance rod 25a, the support table lifting and lowering sections 35 and 45, and the fixing section lifting and lowering sections 36 and 46 to introduce the conveyance jig 80 to which the board support members 70 to be introduced and disposed on the support table 37 and the support table 47 respectively are attached, to lift the support tables 37 and 47, to detach each board support member 70 to be introduced from the conveyance jig 80, to dispose each of the board support members 70 on the support tables 37 and 47 respectively, and to perform a process of discharging the conveyance jig 80 after the detachment. Accordingly, the control section 21 performs the exchange of the board support member 70 disposed on the support table 37 and the exchange of the board support member 70 disposed on the support table 47 in parallel. By doing so, since the board support members 70 to be discharged disposed on the support tables 37 and 47 can be discharged together by the discharge of the conveyance jig 80 once and the board support members 70 to be introduced which are to be disposed on the support tables 37 and 47 can be introduced together by the introduction of the conveyance jig 80 once, the time required for the support member exchange process can be shortened.

It is to be understood that the disclosure is not limited to the embodiment described above in any way and can be implemented in various aspects as long as it falls within the technical scope of the present disclosure.

Figure 11:
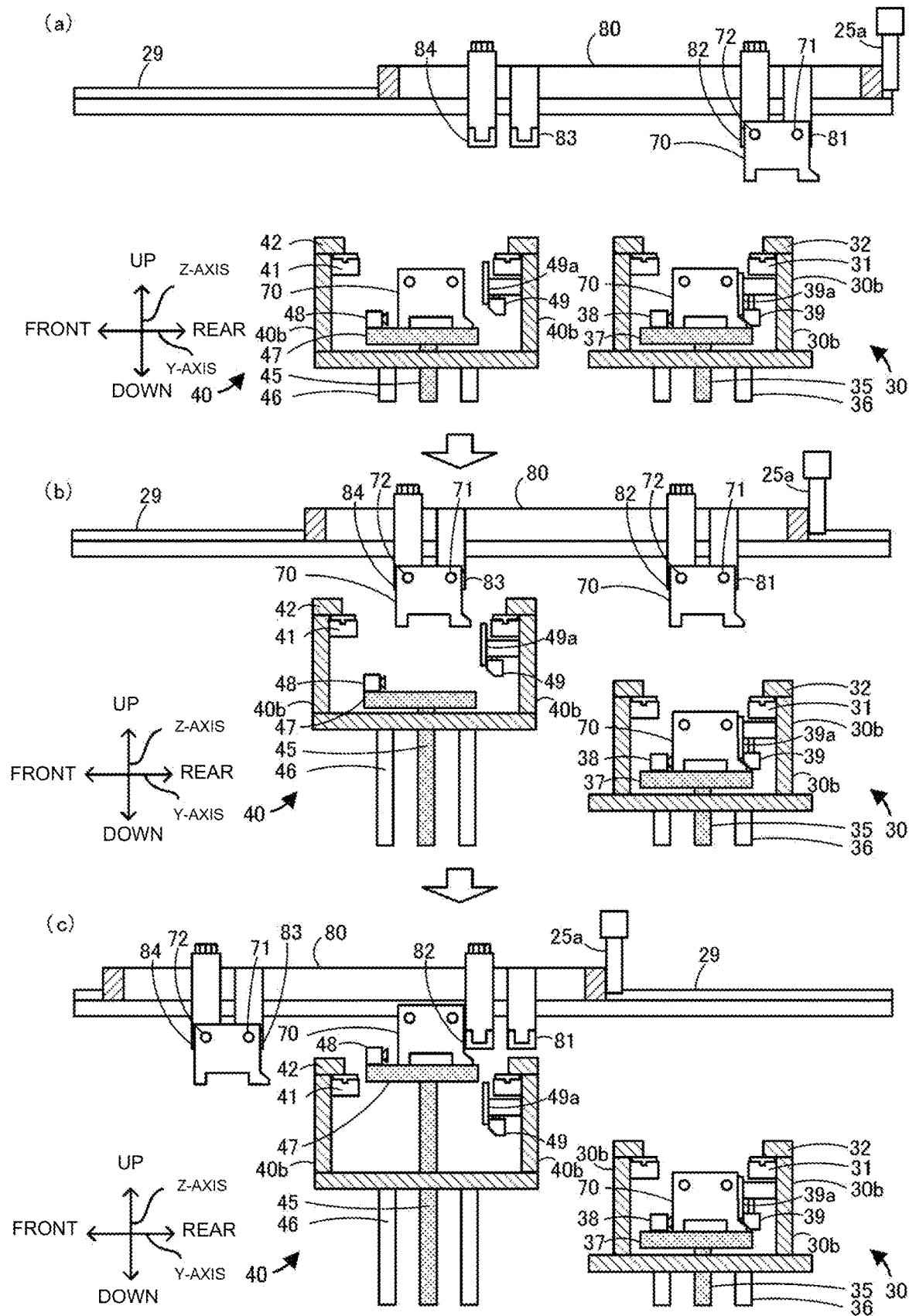
FIG. 11 is an explanatory view illustrating a state where a support member introduction process and a support member discharge process are performed in parallel.

For example, in the embodiment described above, although the control section 21 performs the exchange of the board support member 70 disposed on the support table 37 and the exchange of the board support member 70 disposed on the support table 47 in parallel using the conveyance jig 80 which can attach two board support members 70 thereto, the disclosure is not limited thereto. For example, only one of the board support members 70 on the support tables 37 or 47 may be exchanged. In addition, in this case, the control section 21 may perform the support member introduction process and the support member discharge process in parallel. FIG. 11 is an explanatory view illustrating a state where the support member introduction process and the support member discharge process are performed in parallel. Here, a case where the board support member 70 of the second board fixing section 40 is exchanged will be described. First, the control section 21 conveys the conveyance jig 80 to which the board support member 70 to be introduced is attached above the second board fixing section 40 (FIG. 11(*a*)). Subsequently, the control section 21 lifts the board support member 70 to be discharged disposed on the support table 47 to attach the board support member 70 to the conveyance jig 80 (FIG. 11(*b*)). Next, after the attachment, the control section 21 further conveys the conveyance jig 80 forward to convey the board support member 70 to be introduced above the support table 47, to lift the support table 47 to detach the board support member 70 to be introduced from the conveyance jig 80 and to dispose the board support member on the support table 47 (FIG. 11(*c*)). The control section 21 discharges the conveyance jig 80 after the detachment (conveyance jig 80 to which the board support member 70 to be discharged is attached) rearward. By doing so, the discharge and the introduction of the board support member 70 can be performed by discharging and introducing the conveyance jig 80 once. Therefore, the time required for the support member exchange process can be shortened.

In the embodiment described above, although the printing device 20 can discharge and introduce the screen mask M and the board support member 70 together by using the conveyance rod 25*a*, the disclosure is not limited thereto. At least the board support member exchange process can be performed as long as the disclosure includes a support member conveyance section which performs the discharging and the introduction of the board support member 70. In addition, even in this case, by moving the board support members 70 disposed on the first and/or the second board fixing sections 30 and/or 40 and performing the positioning of the board support members in the horizontal direction, an effect of suppressing positional deviation in the first and/or the second board fixing sections 30 and/or 40 of the board support members 70 in the front-rear direction can be obtained. In the embodiment described above, although the printing device 20 that performs exchange of the board support member 70 is described, it is not limited to the printing device as long as it performs the board support member exchange process. The disclosure can be applied to a board work device that performs a board work on a board fixed on aboard support member. As a board work device other than the printing device, for example, a mounting device that performs a component mounting process on a board can be included, as an example. In addition, in the embodiment described above, although the printing device 20 includes the conveyance rod 25*a* as a support member conveyance section, as long as the support member conveyance section can perform the discharge and the introduction of the board support member 70, any support member conveyance section may be provided. For example, the support member conveyance section may be a support member conveyance conveyor including a conveyor belt and a belt revolving device that revolves and drives the conveyor belt.

In the embodiment described above, although the board support member 70 is conveyed by using the conveyance jig 80, the conveyance jig 80 may not be used if the board support member 70 can be conveyed by using the conveyance rail 29 and the conveyance rod 25*a*.

In the embodiment described above, although the Y-axis pressing section 38, the board guide moving section 33, and the support plate 39*a* are used to perform the positioning of the board support member 70 in the front-rear direction, the disclosure is not limited thereto as long as the positioning is performed in the horizontal direction. For example, the positioning in the left-right direction may be performed in addition to or in place of the positioning in the front-rear direction.

In the embodiment described above, although the protruding sections 71 and 72 of the board support member 70 are formed in a cylindrical column shape, the protruding sections are not limited thereto as long as the protruding sections can be attached to and detached from the conveyance jig 80. For example, the protruding section may have a square prism shape, a plate shape, or one member in which two cylindrical columns are adjacent to each other. In addition, although the number of the protruding sections is also two in left and light, the number of the protruding sections is not limited thereto, one or three or more protruding sections may be provided on each of the left and right.

In the embodiment described above, although the first to fourth protrusion holding sections 81 to 84 hold the protruding sections 71 and 72 by the recessed sections, the protrusion holding section is not limited thereto as long as the protrusion holding section can attach and detach the protruding sections 71 and 72 to and from the conveyance jig 80. For example, it is assumed that the conveyance jig 80 includes a pair of plate-like members protruding inside the frame body 85, and the protruding sections 71 and 72 are placed on the upper face of the plate-like members, whereby attachment of the board support member 70 to the conveyance jig 80 may be performed. In addition, although when the board support member 70 is detached from the conveyance jig 80, the lifting of the board support member 70 and the conveyance of the conveyance jig 80 are combined with each other, the disclosure is not limited thereto. For example, the conveyance jig 80 may include a plate-like member moving mechanism which includes a button that can be pushed downward, a lever that rotates around its axis by lowering the button and converts movement in the up-down direction into movement in the left-right direction, and a plate-like member that moves in the left-right direction according to the rotation of the lever. In this case, the board support member 70 is placed on the plate-shaped member of a pair of front and rear plate-like member moving mechanisms and is conveyed, and for example, the buttons of the pair of plate-like member moving mechanisms are pushed down by the conveyance rod 25*a* or the like to separate the pair of plate-like members in left and right and thus may detach the board support member 70 from the conveyance jig 80. By adopting such a mechanism, the operation of conveying the conveyance jig 80 in the front and the rear is not necessary when the board support member 70 is detached from the conveyance jig 80.

In the embodiment described above, although the printing device 20 includes the storage section 60, the printing device 20 may not include the storage section 60. In addition, although the printing device 20 is a dual lane printing device having the first and the second board fixing sections 30 and 40, the printing device is not limited thereto. For example, the printing device 20 may be a single lane printing device having one board fixing section.

In the embodiment described above, although the board support member 70 is a member that sucks and fixes the board S while supporting the board S from the lower face side by negative pressure, the board support member may be any member as long as the board support member fixes the board. For example, the board support member includes multiple protruding sections (backup pins) erected on the upper face and the board support member may support and fix the board S from below by the protruding section.

INDUSTRIAL APPLICABILITY

The present disclosure can be used in a board work device that performs a board work on a board, such as a mounting device for mounting components on a board and a printing device related to the mounting device.

REFERENCE SIGNS LIST

10: mounting system, 11, 12: pattern hole, 20: printing device, 21: control section, 22: printing process section, 23: printing head, 24: head moving section, 25: squeegee, 25a: conveyance rod, 26: mask work section, 27: mask fixing section, 28: position adjustment section, 29: conveyance rail, 30: first board fixing section, 30a: main body, 30b: side frame, 31: board conveyance conveyor, 32: board guide, 33: board guide moving section, 35: support table lifting and lowering section, 36: fixing section lifting and lowering section, 37: support table, 38: Y-axis pressing section, 39: Z-axis clamping section, 39a: a support plate, 40: second board fixing section, 40a: main body, 40b: side frame, 41: board conveyance conveyor, 42: board guide, 43: board guide moving section, 45: support table lifting and lowering section, 46: fixing section lifting and lowering section, 47: support table, 48: Y-axis pressing section, 49: Z-axis clamping section, 49a: support plate, 50: processing section, 51: carriage, 52: processing section moving section, 53: X-axis slider, 54: Y-axis slider, 55: positional information acquiring section, 56: board stopper, 58: support rail, 60: storage section, 61: conveyance conveyor, 62: conveyor lifting and lowering section, 70: board support member, 70a: main body section, 71, 72: protruding section, 73: suction hole, 74: clamped section, 75: identification section, 76: bar code, 80: conveyance jig, 81 to 84: first to fourth protrusion holding section, 85: frame body, 86: bar code, 90: management PC, M, M2: screen mask, S: board.

The invention claimed is:

1. A printing device which performs a printing process of a viscous fluid on a board fixed on a board support member by using a screen mask, the printing device comprising:
   a support member conveyance section which discharges and introduces the screen mask and the board support member; and
   an exchange control section which can perform a mask exchange process including a mask discharge process of discharging the screen mask to be discharged and a mask introduction process of introducing the screen mask to be introduced by controlling the support member conveyance section and can perform a support member exchange process including a support member discharge process of discharging the board support member to be discharged and support member introduction process of introducing the board support member to be introduced by controlling the support member conveyance section.

2. The printing device according to claim 1, further comprising:
   a board fixing section which can dispose the board support member thereon and fixes the board by the disposed board support member when the printing process is performed; and
   a positioning section which performs positioning of the board support member in a horizontal direction by moving the board support member disposed on the board fixing section,
   wherein the exchange control section controls the support member conveyance section to convey the board support member to be introduced into the board fixing section and controls, the positioning section to perform the positioning of the conveyed board support member in the support member introduction process.

3. The printing device according to claim 1, further comprising:
   a board fixing section which can dispose the board support member thereon and fixes the board by the disposed board support member when the printing process is performed;
   a board conveyance section which conveys the board in a predetermined board conveyance direction;
   a positional information acquiring section which acquires positional information related to a position of the board support member disposed on the board fixing section in the board conveyance direction; and
   a correction section which corrects a stopping position on the board support member based on the acquired positional information when the board conveyance section conveys the board.

4. The printing device according to claim 1, further comprising:
   a board fixing section which has a support table which can dispose the board support member thereon and fixes the board by the disposed board support member when the printing process is performed; and
   a support member lifting and lowering section which lifts and lowers the board support member disposed on the support table by lifting and lowering the support table,
   wherein the support member conveyance section discharges and introduces a conveyance jig which can attach the board support member thereto, and
   wherein in the support member discharge process, the exchange control section conveys the conveyance jig to convey the conveyance jig above the board fixing section, lifts the board support member to be discharged disposed on the support table to attach the board support member to the conveyance jig, and performs a process of discharging the conveyance jig after the attachment by controlling the support member conveyance section and the support member lifting and lowering section, and in the support member introduction process, the exchange control section conveys the conveyance jig to which the board support member to be introduced is attached above the board fixing section, lifts the support table to detach the board support member to be introduced from the conveyance jig and then to dispose the board support member on the support table, and performs a process of discharging the conveyance jig after the detachment, by controlling the support member conveyance section and the support member lifting and lowering section.

5. The printing device according to claim 4,
wherein the conveyance jig can attach multiple the board support members thereto, and
wherein in the support member exchange process, the exchange control section conveys the conveyance jig to which the board support member to be introduced is attached above the board fixing section, lifts the board support member to be discharged disposed on the support table to attach the board support member to the conveyance jig, conveys the conveyance jig after the attachment to convey the board support member to be introduced above the support table, lifts the support table to detach the board support member to be introduced from the conveyance jig and then to dispose the board, support member on the support table, and performs a process of discharging the conveyance jig after the detachment so that the support member discharge process and the support member introduction process are performed in parallel, by controlling the support member conveyance section and the support member lifting and lowering section.

6. The printing device according to claim 4,
wherein the board fixing section has a first board fixing section which has a first support table which can dispose the hoard support member thereon and fixes the board by the disposed board support member when the printing process is performed and a second board fixing section which has a second support table which can dispose the board support member thereon and fixes the board by the disposed board support member when the printing process is performed,
wherein the support member lifting and lowering section has a first support member lifting and lowering section which lifts and lowers the board support member disposed on the first support table by lifting and lowering the first support table and a second support member lifting and lowering section which lifts and lowers the board support member disposed on the second support table by lifting and lowering the second support table,
wherein the support member conveyance section discharges and introduces the conveyance jig which can attach the multiple board support members thereto, and
wherein in the support member discharge process, the exchange control section introduces the conveyance jig, lifts each of the board support members to be discharged disposed on the first and the second support tables to attach the board support member to the conveyance jig, and performs a process of discharging the conveyance jig after the attachment, by controlling the support member conveyance section and the first and the second support member lifting and lowering sections and in the support member introduction process, the exchange control section introduces the conveyance jig to which the board support members to be introduced are attached disposed on the first and the second support tables, respectively, lifts the first and the second support tables to detach each of the board support members to be introduced from the conveyance jig to dispose the board support members on the first and the second support tables, respectively, and performs a process of discharging the conveyance jig after the detachment so that the exchange of the board support member disposed on the first support table and the exchange of the board support member disposed on the second support table are performed in parallel, by controlling the support member conveyance section and the first and the second support member lifting and lowering sections.

\* \* \* \* \*